United States Patent
Jagannathan et al.

(10) Patent No.: US 9,741,822 B1
(45) Date of Patent: Aug. 22, 2017

(54) SIMPLIFIED GATE STACK PROCESS TO IMPROVE DUAL CHANNEL CMOS PERFORMANCE

(71) Applicant: INTERNATIONAL BUSINESS MACHINES CORPORATION, Armonk, NY (US)

(72) Inventors: Hemanth Jagannathan, Niskayuna, NY (US); ChoongHyun Lee, Rensselaer, NY (US); Richard G. Southwick, III, Halfmoon, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/275,565

(22) Filed: Sep. 26, 2016

(51) Int. Cl.
| | |
|---|---|
| *H01L 29/66* | (2006.01) |
| *H01L 21/28* | (2006.01) |
| *H01L 27/092* | (2006.01) |
| *H01L 29/10* | (2006.01) |
| *H01L 29/161* | (2006.01) |
| *H01L 29/16* | (2006.01) |
| *H01L 29/51* | (2006.01) |
| *H01L 29/49* | (2006.01) |
| *H01L 21/8238* | (2006.01) |
| *H01L 21/324* | (2006.01) |

(52) U.S. Cl.
CPC .. *H01L 29/66545* (2013.01); *H01L 21/28238* (2013.01); *H01L 21/28255* (2013.01); *H01L 21/324* (2013.01); *H01L 21/823807* (2013.01); *H01L 21/823828* (2013.01); *H01L 21/823857* (2013.01); *H01L 27/092* (2013.01); *H01L 29/1054* (2013.01); *H01L 29/16* (2013.01); *H01L 29/161* (2013.01); *H01L 29/4966* (2013.01); *H01L 29/517* (2013.01); *H01L 29/518* (2013.01)

(58) Field of Classification Search
CPC ......... H01L 29/66545; H01L 21/28255; H01L 21/28238
See application file for complete search history.

(56) References Cited

U.S. PATENT DOCUMENTS

| | | | |
|---|---|---|---|
| 9,159,833 | B2 | 10/2015 | Ching et al. |
| 9,202,917 | B2 | 12/2015 | Ching et al. |

(Continued)

FOREIGN PATENT DOCUMENTS

| | | |
|---|---|---|
| CN | 104810404 A | 7/2015 |
| JP | H02150069 A | 6/1990 |

(Continued)

OTHER PUBLICATIONS

Chinese Patent No. 104810404(A); Date of Publication: Jul. 29, 2015; Machine Translation; 8 Pages.

(Continued)

*Primary Examiner* — Matthew Reames
(74) *Attorney, Agent, or Firm* — Cantor Colburn LLP; Vazken Alexanian

(57) ABSTRACT

A semiconductor device and method of making the same wherein the semiconductor device includes a pFET region including a SiGe channel having a Si-rich top surface within the gate portion, and an nFET region including a Si channel. The method includes subjecting both the pFET and nFET regions to a single high-temperature anneal process thereby avoiding the need for an additional spike anneal process at RMG module.

13 Claims, 12 Drawing Sheets

(56) References Cited

U.S. PATENT DOCUMENTS

| | | |
|---|---|---|
| 9,330,899 B2 | 5/2016 | Jung et al. |
| 2015/0028426 A1 | 1/2015 | Ching et al. |
| 2015/0144998 A1 | 5/2015 | Ching et al. |

FOREIGN PATENT DOCUMENTS

| | | |
|---|---|---|
| KR | 0129580 B1 | 11/1997 |
| KR | 1020130105224 A | 9/2013 |
| KR | 102016000162 A | 1/2016 |

OTHER PUBLICATIONS

Japanese Patent No. H02150069(A); Date of Publication: Jun. 8, 1990; Machine Translation; 4 Pages.

Korean Patent No. 0129580(B1); Date of Publication: Nov. 11, 1997; Machine Translation; 3 Pages.

Korean Patent No. 1020130105224(A); Date of Publication: Sep. 25, 2013; Machine Translation; 8 Pages.

Korean Patent No. 1020160001621(A); Date of Publication: Jan. 6, 2016; Machine Translation; 19 Pages.

SIMPLIFIED GATE STACK PROCESS TO IMPROVE DUAL CHANNEL CMOS PERFORMANCE

BACKGROUND

The present invention relates to integrated circuit chips, and more specifically, to a design structure for upside-down field effect transistors.

Integrated circuits (ICs) are implemented using a plurality of interconnected field effect transistors (FETs), which can be realized as metal oxide semiconductor field effect transistors (MOSFETs or MOS transistors). The MOS transistor can include both a p-type device and an n-type device, wherein such a device is commonly referred to as a complimentary MOS or CMOS device. A MOS transistor includes a gate electrode as a control electrode that is formed over a semiconductor layer having spaced-apart source and drain regions formed therein. Because of the higher density per unit area of microelectronic devices on a chip, it is a challenge to reduce the parasitic or unwanted capacitance between the gate conductor line and the metal filled vias that form the contacts to the device source and drain.

SUMMARY

According to one embodiment, a semiconductor device is provided. The semiconductor device includes a pFET region including a first set of spacers extending from the top surface of the SiGe channel, wherein between the first set of spacers defines a first gate, and a Si-rich surface on a portion of the top surface of the SiGe channel between the first set of spacers, wherein the first gate includes a first high-k dielectric layer in contact with the spacers, and a first metal gate material in contact with the high-k dielectric layer; and an nFET region including a Si channel, and a second set of spacers extending from the top surface of the Si channel, wherein between the second set of spacers defines a second gate, wherein the second gate includes a high-k dielectric layer in contact with the second set of spacers, and a second metal gate material in contact with the second high-k dielectric layer.

According to one embodiment, a method of forming a semiconductor device is provided. The method includes providing a pFET region including a SiGe channel, a first set of spacers extending from the top surface of the SiGe channel, and a first dummy oxide including SiGeOx, wherein the first dummy oxide layer is positioned between the first set of spacers; providing an nFET region including a Si channel, a second set of spacers extending from the top surface of the Si channel, and a second dummy oxide layer including SiOx, wherein the second dummy oxide layer is positioned between the second set of spacers; annealing the pFET and the nFET region to yield a Si-rich layer on a top surface of the SiGe channel; removing the first dummy oxide layer and the second dummy oxide layer; depositing a first gate material between the first set of spacers and a second gate material between the second set of spacers.

BRIEF DESCRIPTION OF THE DRAWINGS

FIGS. 8-15 illustrate an exemplary fabrication process of forming a semiconductor device according to an embodiment, in which:

FIG. 8 is a cross-sectional view illustrating a portion of the semiconductor device according to an embodiment including an SiGe channel and a dummy gate;

FIG. 9 is a cross-sectional view illustrating a portion of the semiconductor device according to an embodiment including an Si channel and a dummy gate;

FIG. 10 is a cross-sectional view of a portion of the semiconductor device illustrating formation of a source/drain in the SiGe channel;

FIG. 11 is a cross-sectional view of a portion of the semiconductor device illustrating the formation of a source/drain in the Si channel;

FIG. 12 is a cross-sectional view of a portion of the semiconductor device including the SiGe channel illustrating the deposition of an ILD layer followed by removal of the dummy gate and dummy oxide;

FIG. 13 is a cross-sectional view of a portion of the semiconductor device including the Si channel illustrating the deposition of an ILD layer followed by removal of the dummy gate and dummy oxide;

FIG. 14 is a cross-sectional view of a portion of the semiconductor device including the SiGe channel illustrating the deposition of a high-k dielectric layer, a metal gate, and a fill metal; and FIG. 15 is a cross-sectional view of a portion of the semiconductor device including the Si channel illustrating the deposition of a high-k dielectric layer, a metal gate, and a fill metal.

DETAILED DESCRIPTION

Figure 1:
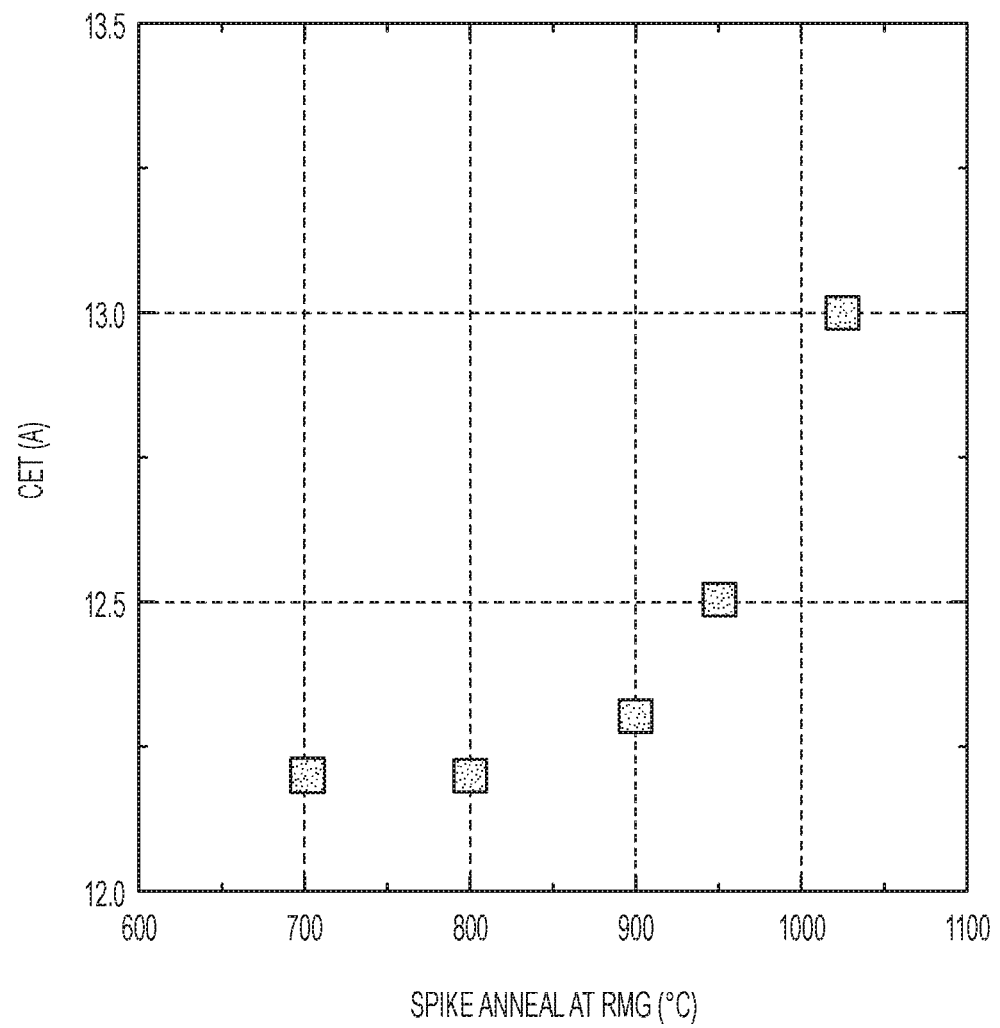
FIG. 1 is a graph of CET versus spike anneal temperature at RMG for a conventional Si nFET.

It is understood in advance that, although embodiments of the invention include a detailed description of the formation of and resulting structures for a specific type of FET, implementation of the teachings recited herein are not limited to a particular type of semiconductor device or IC architecture. Rather embodiments of the present invention are capable of being implemented in conjunction with any other type semiconductor device or IC architecture, now known or later developed, as long as the semiconductor device incorporates the essential features described herein.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). In the following invention "front-side" refers to the surface on which the integrated circuit devices are made prior to flipping over the FET, and "back-side" refers to the surface that is to become the top surface after the device is turned over and bonded to a handling wafer.

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device includes drain and source regions and a gate electrode structure positioned above and between the source/drain regions. Upon application of an appropriate control voltage to the gate electrode, a conductive channel region forms between the drain region and the source region.

For many early device technology generations, the gate structures of most transistor elements (planar and FinFET devices) were formed from a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which can be associated with the use of traditional silicon-based materials in reduced channel length transistors. For example, in some aggressively scaled transistor elements, which can have channel lengths on the order of approximately 10-32 nm or less, gate structures that include a so-called high-k dielectric gate insulation layer (k-value of approximately 10 or greater) and one or more metal layers that function as the gate electrode have been implemented. Such alternative gate structures—typically known as high-k/metal gate structures (HK/MG structures)—have been shown to provide significantly enhanced operational characteristics over the heretofore more traditional silicon dioxide/polysilicon gate structure configurations.

One well-known processing method that has been used for forming a transistor with a high-k/metal gate structure is the so-called "gate last" or "replacement gate" technique. Generally, the replacement gate process involves: forming a basic transistor structure (planar, FinFET, nanowire, etc.) with a sacrificial or dummy gate structure positioned between sidewall spacers; forming the source/drain regions for the device; performing the necessary anneal process to activate implanted dopant materials; removing the sacrificial gate structure so as to define a gate cavity for the replacement gate structure between the spacers; depositing a high-k gate insulation layer and a plurality of metal layers in the gate cavity; performing a CMP process to remove excess materials positioned outside of the gate cavity; recessing the gate materials within the gate cavity to make room for a gate cap layer; and forming a gate cap layer in the gate cavity above the recessed gate materials.

However, as the gate length of transistor devices has decreased, the physical size of the gate cavity has also decreased. Thus, it is becoming physically difficult to fit all of the layers of material needed for a high-k dielectric/metal gate (HK/MG) replacement gate structure within such reduced-size gate cavities, particularly for NMOS devices, due to the greater number of layers of material that are typically used to form the HK/MG structures for the NMOS devices as compared to PMOS devices. For example, as gate lengths continue to decrease, voids or seams can be formed as the various layers of material are deposited into the gate cavity. That is, as the layers of material for the replacement gate are formed in the gate cavity, the remaining space within the gate cavity becomes very small. As the later metal layers are formed, the remaining space within the gate cavity can be only about 1-2 nm in width or even smaller. In some cases, there can be essentially no remaining space in the gate cavity. This can lead to so-called "pinch-off" of metal layers such that voids or seams can be formed in the overall replacement gate structure, which can result in devices that perform at levels less than anticipated or, in some cases, the formation of devices that are simply not acceptable and have to be discarded.

Further, dangling bonds at the silicon/silicon oxide interface in semiconductor devices are believed to be the cause of observed non-ideal capacitance-voltage characteristics and reduced channel conductance. Low temperature post-metallization annealing in a hydrogen-containing atmosphere is typically used in the semiconductor device fabrication process, to passivate these dangling bonds. During operation, however, transistor performance can degrade, and this degradation has been correlated to the removal of hydrogen from the silicon/silicon oxide interface, due to collisions between heated carriers and the interface. This degradation in hot carrier lifetime (also referred to as HCl lifetime) is exacerbated by the ever ongoing miniaturization of semiconductor devices, and has become a significant limitation in the further shrinkage of semiconductor devices.

For example, a metal layer formed from a metal that can serve as a barrier layer to protect the high-k gate insulation layer can be subjected to a so-called "spike anneal at replacement metal gate (RMG)" process that will be performed to increase the reliability of the high-k gate insulation layer. In an example, a metal layer can be formed by performing a plasma-enhanced physical vapor deposition (PVD) process. A silicon-containing material layer, such as polysilicon or amorphous silicon, can be blanket-deposited on the product so as to over-fill the gate cavity. The silicon-containing material layer can be formed by performing, for example, a CVD process. After the silicon-containing material layer is formed, an anneal process can be performed to increase the reliability of the high-k gate insulation layer. The parameters of such an anneal process are well known to those skilled in the art. The silicon-containing layer can then be removed by performing an etching process. In some cases, metal layer that was used in the spike anneal of the high-k gate insulation layer can be removed (by selective etching relative to the high-k gate insulation layer) and a "new" metal layer can be formed on the high-k gate insulation layer.

In recent years, strain engineering has been used as a means to increase the performance of semiconductor devices. Strain engineering introduces a strain into material within a channel region of a semiconductor device to improve the performance of the device. Strain is often induced by forming a lattice mismatch between materials in the channel region. For example, a lattice mismatch can be formed by depositing a layer of silicon over layer of silicon germanium. The atoms in the silicon layer align with the atoms of the underlying silicon germanium layer (which are arranged further apart), stretching the silicon material. The stretched silicon material reduces interference with the movement of charge carriers, thereby improving mobility within the channel region.

Figure 2:
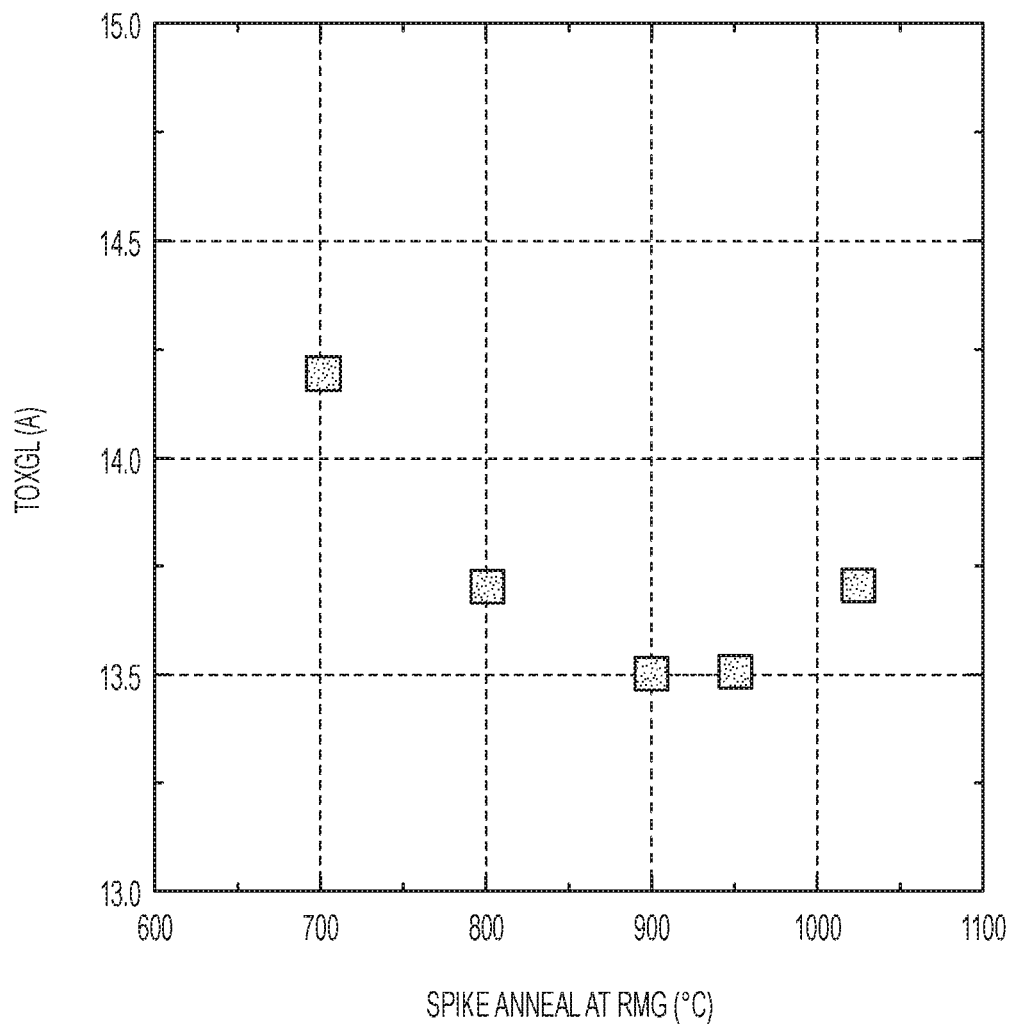
FIG. 2 is a graph of Toxgl versus spike anneal temperature at RMG for a conventional Si nFET.

A promising dual channel CMOS integration schemes for future technologies is to use tensile-strained Si for nFETS and compressively-strained SiGe grown on an Si substrate for pFETs. However, for replacement metal gate processes, high temperature spike anneal is necessary to improve SiGe pFET performance while an Si nFET doesn't necessarily have to get processed. Further, the spike anneal at RMG also increases equivalent oxide thickness of gate stack as spike anneal temperature increases. For example, FIG. 1 is a graph illustrating capacitance equivalent thickness (CET) (CET=EOT+0.4A) increases as the spike temperature increases. As shown in FIG. 2, an increase in spike anneal temperature degrades Toxgl, wherein Toxgl stands for gate dielectric thickness for gate leakage calculation.

Figure 3:
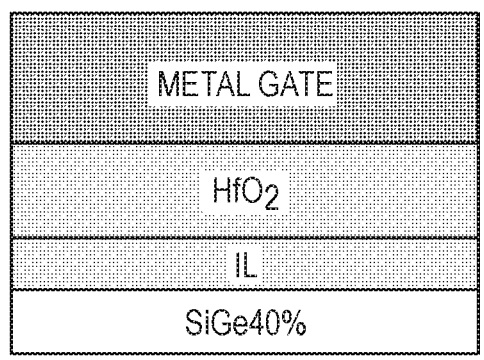
FIG. 3 illustrates a conventional SiGe gate stack.
Figure 4:
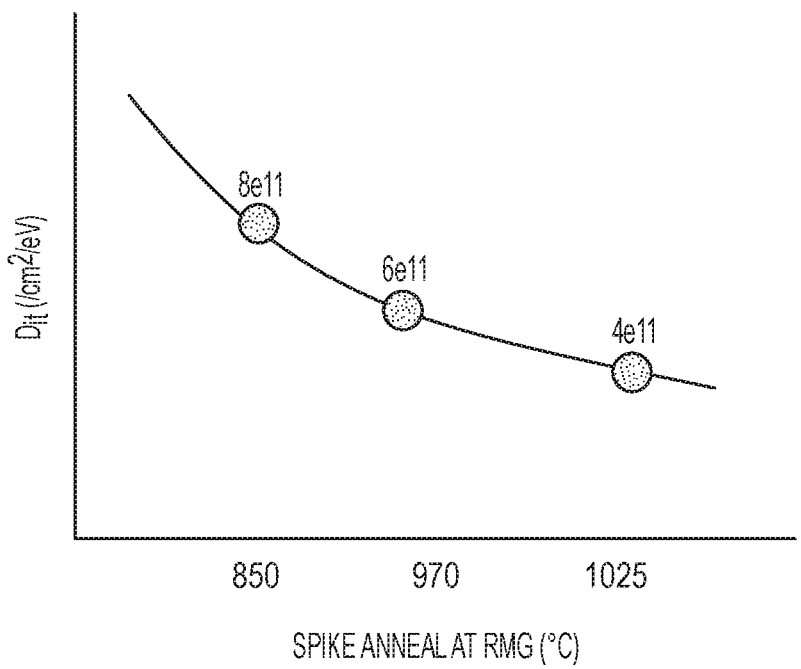
FIG. 4 is a graph illustrating the $D_{it}$ versus spike anneal temperature at RMG of the SiGe gate stack illustrated in FIG. 3.

FIGS. 3-4 illustrate the impact of spike anneal at RMG on an SiGe gate stack. FIG. 4 illustrates the density of interface trap ($D_1$) decreases as spike anneal temperature increases.

Figure 5B:
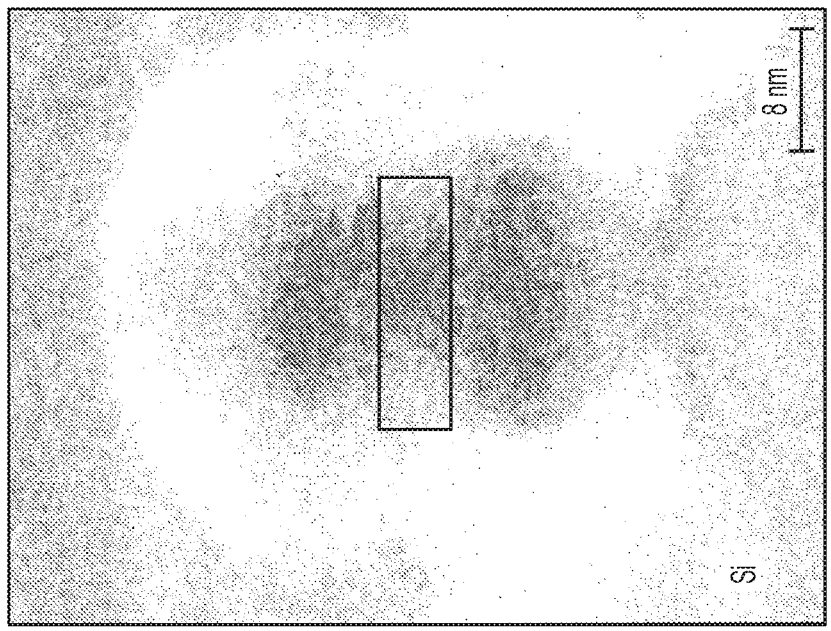
FIGS. 5A-5B illustrates a conventional a-Si residue after spike anneal in a nanosheet.
Figure 5A:

In addition, a spike anneal package at RMG is not suitable for nanosheet or aggressively scaled FinFET applications, which have a tight Fin pitch. The spike package can pinch-off the space between each sheet or Fin and therefore increase difficulty in removing the annealed Si residue, as illustrated in Energy Dispersive X-Ray microanalysis of the nanosheet nFET of FIGS. 5A-5B. As shown in FIG. 5A, the SiGe layer is not fully released. Further, the a-Si residue remains after spike anneal as shown in the box of FIG. 5B. As shown in FIGS. 5A-5B, the a-Si residue cannot be removed totally after spike anneal. Even under the best conditions, it is challenging to remove a-Si for wide sheet applications.

Figure 6:
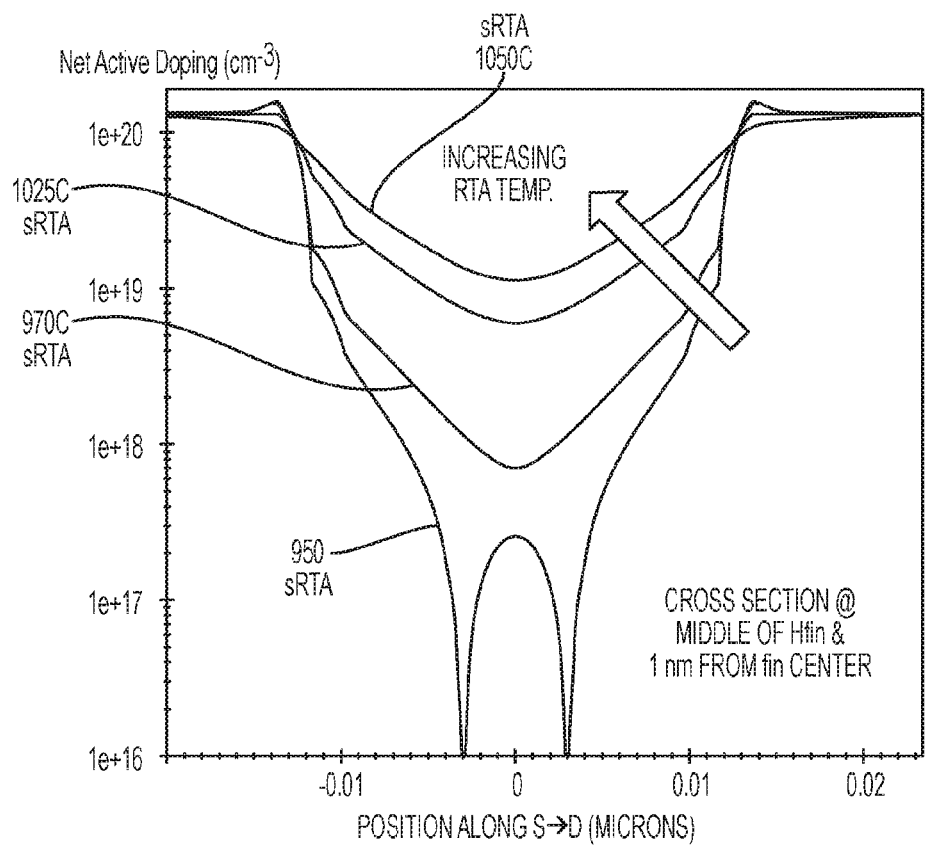
FIG. 6 is a graph illustrating source/drain dopant diffusion for a conventional Si channel during spike anneal at RMG.
Figure 7:
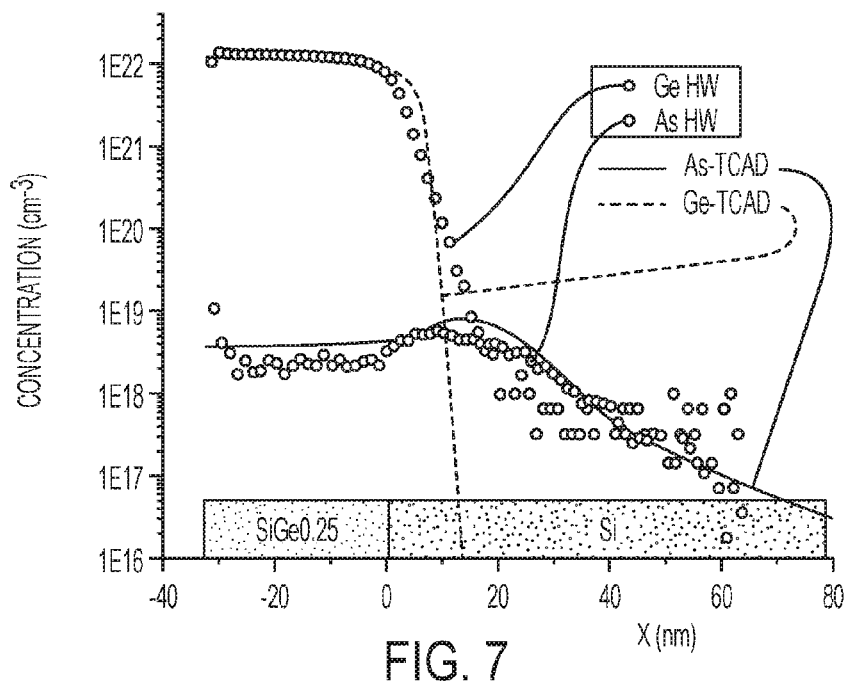
FIG. 7 is a graph illustrating the PTS dopant diffusion for a conventional SiGe channel during spike anneal.

High thermal budget of spike package at RMG is another concern for diffusion of the source/drain and punch-through stopper dopants into the channel, which is critical to control short channel devices performance. FIGS. 6-7 illustrate source/drain dopant and PTS dopant diffusion, respectively, due to thermal budget. In FIG. 6, x-axis is the lateral position of short channel device along the source to drain. Y-axis is the doping concentration of device. Thus, initial channel length is defined approximately 15 nm. In FIG. 7, x-axis is the vertical position of device, where SiGe0.25 is the surface (channel) on Si substrate. Y-axis is the doping concentration of device. SiGe0.25 channel is undoped before spike anneal. As shown in FIG. 6, the source/drain dopant (P) diffuses into the Si channel during spike anneal. As shown in FIG. 7, the PTS dopant (As) also diffuses into the SiGe channel during spike anneal.

Embodiments of the present invention are directed to a spike anneal process to improve the gate stack on a Si/SiGe dual channel CMOS transistor. An exemplary transistor includes a SiGeOx layer on an SiGe channel and the use of SiO$_2$ layer on an Si channel as a dummy oxide, followed by high temperature dummy gate anneal (950° C. to 1077° C.). The high temperature dummy gate anneal only modifies the SiGe surface due to the reaction of SiGiOx dummy oxide with SiGe surface during. After the high temperature dummy gate anneal, a Si-rich SiGe surface is formed, resulting in a low interface trap charge and high hole mobility in SiGe pFET. For the Si nFET, there is no reaction of SiO$_2$ dummy oxide with the Si surface during the dummy gate anneal.

The Si-rich SiGe surface is defined as the Ge content at the SiGe surface is at least 10% lower than SiGe channel layer. For example, if the Ge content at the SiGe surface is less than 15% on SiGe25% layer after dummy gate anneal, we call it as Si-rich SiGe surface.

FIGS. 8-15 illustrate an exemplary fabrication process of forming a semiconductor device according to an embodiment.

Figure 8:
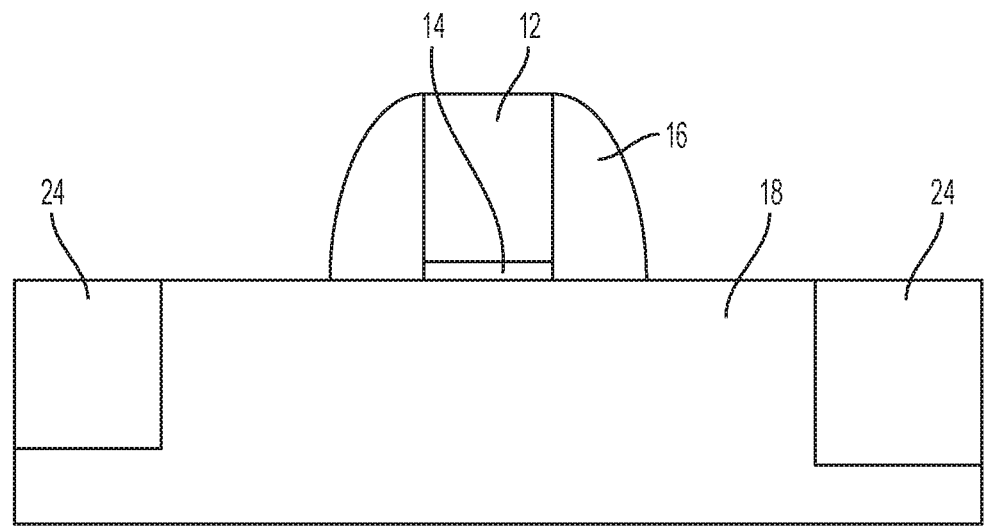

As shown in FIG. 8, a first dummy gate 12 and first dummy oxide 14 is provided between first spacers 16 on a SiGe channel 18. The first dummy oxide layer 14 includes SiGeOx. As shown in FIG. 8, a second dummy gate 26, second dummy oxide 28, and second spacers 30 are formed on a Si channel 32. Although Si is the predominately used semiconductor material in wafer fabrication, other materials can be used including, but not limited to, germanium, gallium arsenide, gallium nitride, cadmium telluride, and zinc selenide. The semiconductor channels can include Si, SiGe, SiGeC, Si:C, polysilicon, epitaxial Si, amorphous Si, and multi-layers thereof. In an example, FIG. 8 refers to a pFET and FIG. 9 refers to an nFET. As shown in both FIGS. 8-9, the respective channels can include shallow trench isolation portions 24.

The dummy oxides 14, 28 and dummy gates 12, 26 can include a sacrificial polysilicon material that can be deposited using a conventional chemical vapor deposition (CVD) process and/or plasma enhanced CVD on the respective channels. As understood by those skilled in the art, the polysilicon material (with the oxide) are associated with the formation of structures commonly referred to as "dummy gate" structures. The polysilicon material of the dummy gate structures will be subsequently removed later in the fabrication process and replaced with a metal gate stack defining the actual operating gate electrode for the transistor devices (this process referred to in the art as a "replacement metal gate (RMG)" process). The top surface of the sacrificial polysilicon material deposit can be polished using conventional chemical-mechanical planarization (CMP) techniques to provide a planar top surface between the respective spacers.

Figure 9:
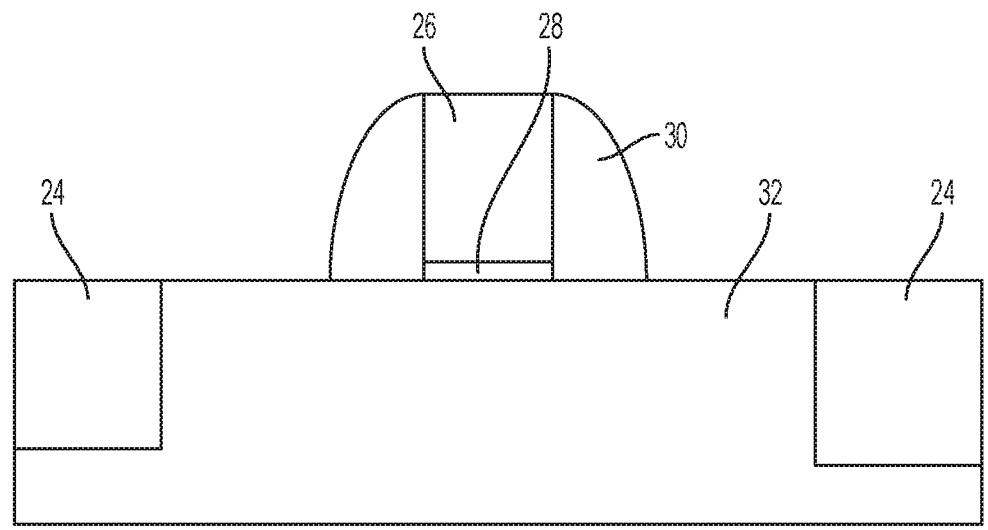

The portions of the semiconductor illustrated in FIGS. 8-9 are annealed. The annealing conditions can be any suitable annealing conditions. For example, the portions illustrated in FIGS. 8-9 can be annealed in a nitrogen-containing atmosphere. This atmosphere preferably contains 80-100% nitrogen, by volume. The remaining portion of the atmosphere is not limited, but preferably contains an inert gas, such as helium, neon, argon, krypton, xenon and mixtures thereof. Other possible gases include hydrogen (a small amount of which is commonly present in deuterium), and hydrocarbons or deuterated hydrocarbons such as methane and ethane.

The annealing temperature can be at least 800° C. The maximum temperature for annealing is limited by the tolerance of the structure being annealed to heating without being damaged. In an example, the annealing temperature is between about 950 and 1080° C. The annealing time can be from 1 sec to 10 sec.

Figure 10:
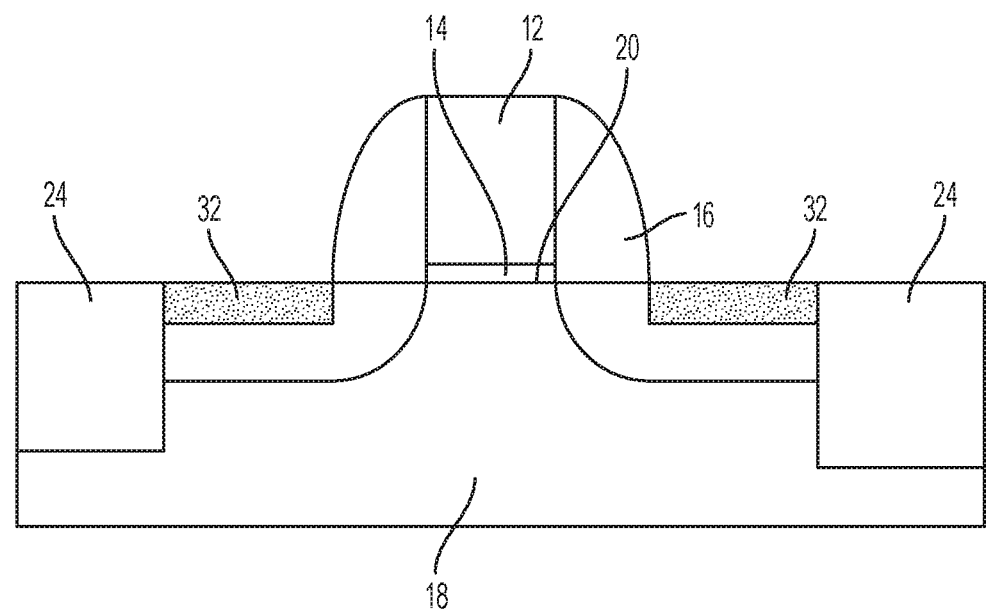

The high temperature dummy gate anneal causes the reaction of SiGeOx with SiGe channel (Ge+GeO$_2$→2 GeO) that results in GeO desorption and provides a Si-rich top surface 20 on SiGe channel 18 (as shown in FIG. 10). During the high temperature anneal, no reaction occurs between the SiOx and the Si channel.

Figure 11:
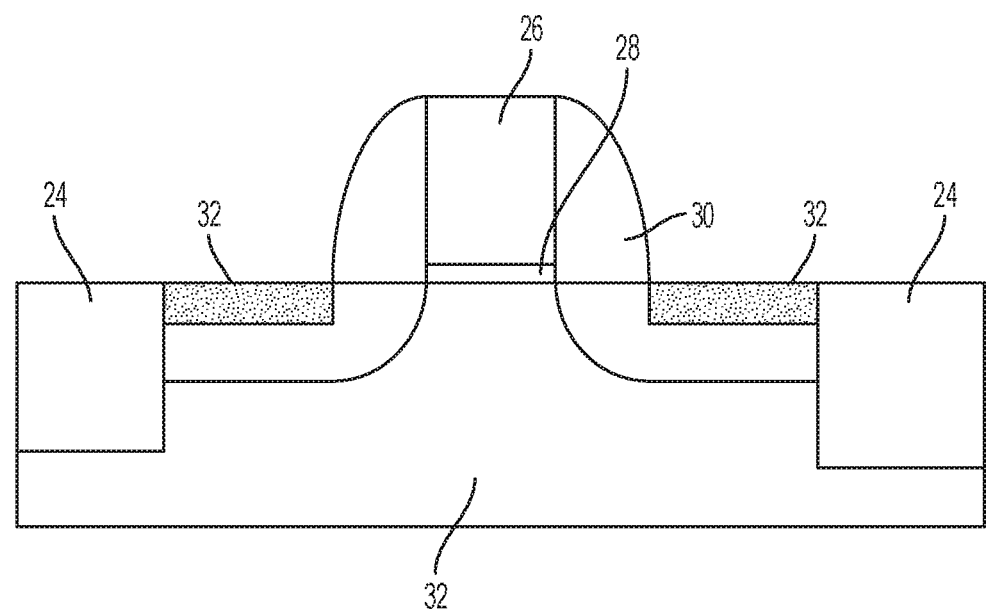

As shown in FIG. 10, after the high temperature anneal is performed, a source/drain 32 is formed in the SiGe channel and in the Si channel, as shown in FIG. 11. The formation of the source/drain can be by any suitable method. S/D formation can be formed by ion implantation, epitaxial growth, and plasma doping. Si nFET S/D dopants can include phosphorus, arsenic, and combinations thereof. SiGe pFET S/D dopants can include boron, gallium, and combinations thereof.

Figure 12:
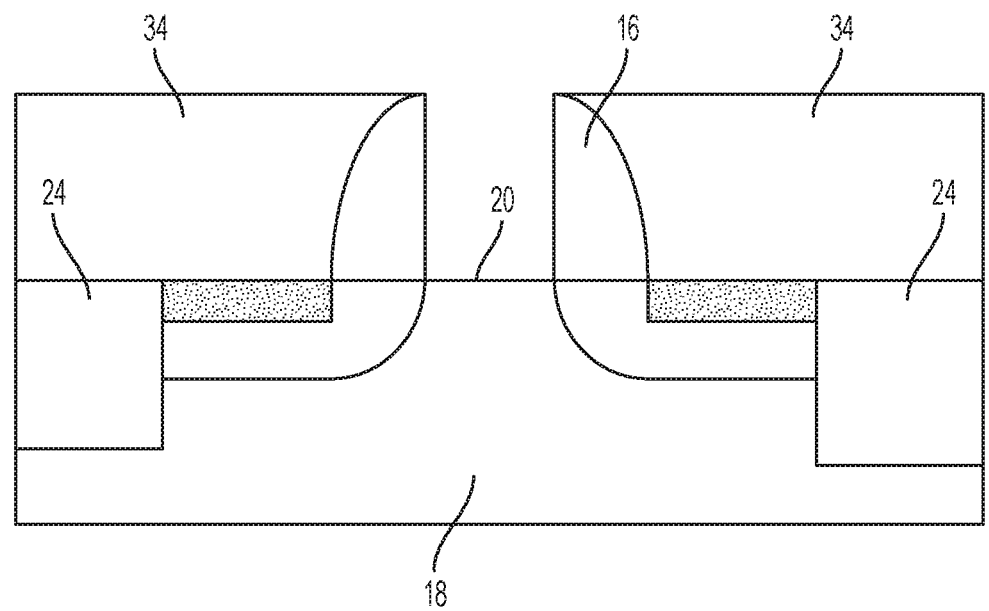
Figure 13:
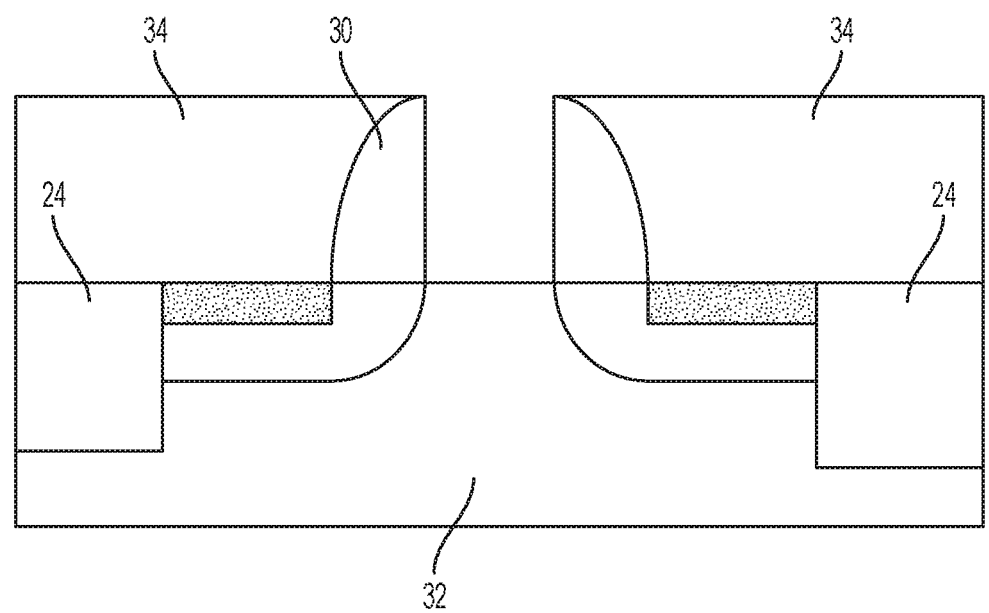

As shown in FIGS. 12-13, a dielectric layer 34 can be deposited and planarized on both the portion of the semiconductor device including a SiGe channel 18 and the Si channel 32. The method includes removal of the first dummy gate 12, thereby exposing the Si-rich top surface 20 of the SiGe channel, and removal of the second dummy gate 26 exposing a surface of the Si channel 32. The removal of the first dummy gate and second dummy gate can be simultaneous.

Figure 14:
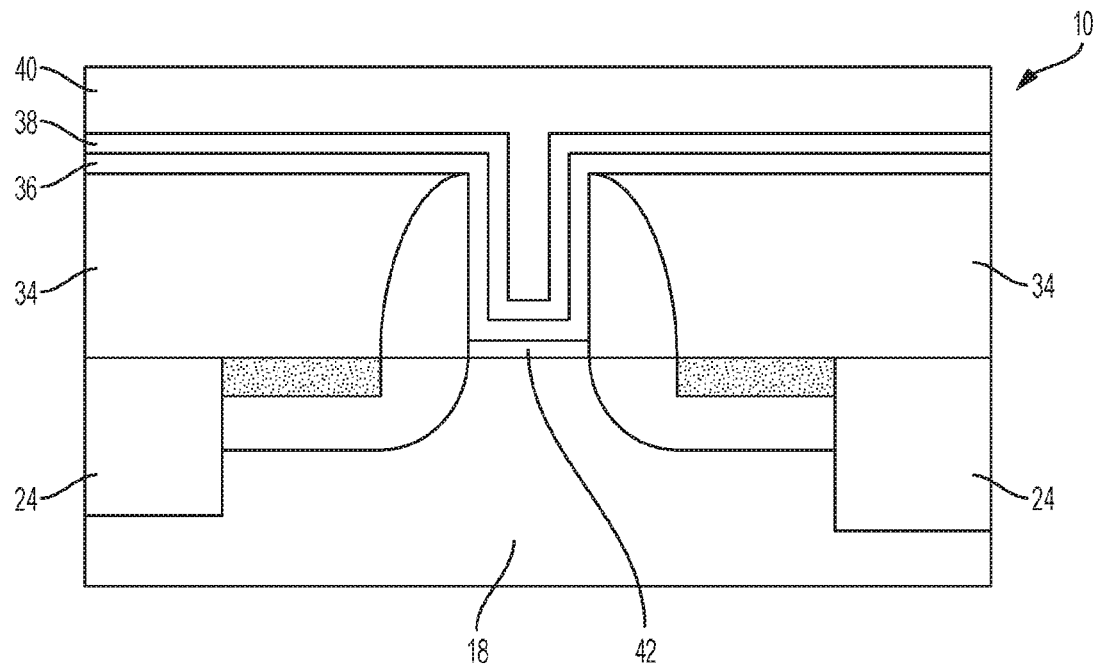
Figure 15:
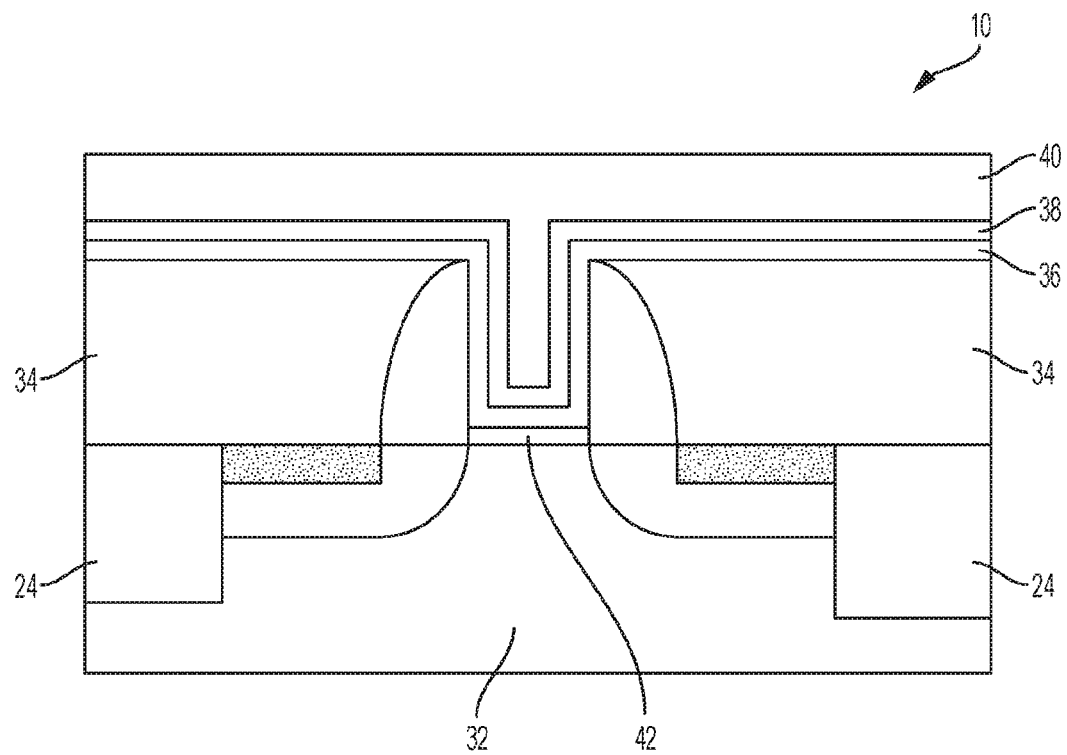

FIGS. 14-15 illustrate the deposition of a high-k dielectric layer 36, followed by the deposition of a metal gate layer 38, and the deposition of a fill metal 40. The high-k dielectric layer can be selected from silicon nitride, aluminum oxide, zirconium oxide, titanium oxide, tantalum pentoxide, barium-strontium-titanate, strontium-titanate-oxide, lead-zirconium-titanate, and combinations thereof. Dielectric materials having high dielectric constants are known as "high K" materials. A widely used dielectric material is silicon dioxide (SiO$_2$), which has a dielectric constant of approximately 3.9. SiO$_2$ has been used as the dielectric material for conventional capacitors and transistors. As used herein, high-k dielectric materials have a dielectric constant greater than SiO$_2$.

In an example, the metal gate layer 38 can include TiN, TiAl, TaN, and combinations thereof. The high-k dielectric layer 36 can include HfO$_2$, Al$_2$O$_3$, La$_2$O$_3$, Y$_2$O$_3$, ZrO$_2$, and combinations thereof. For example, the high-k dielectric layer 36 can include HfAlOx, HfYOx, HfYOx, and combinations thereof. In an example, the fill metal 40 can be tungsten, copper, titanium, and combinations thereof. As shown in FIGS. 14-15, an ozone layer can be formed between the top surface of the SiGe and Si channels and the high-k dielectric layer 36. The ozone layer 42 can be applied by subjecting the gate stack to ozone and water for ten seconds before applying the high-k dielectric layer 36.

EXAMPLES

Figure 16:
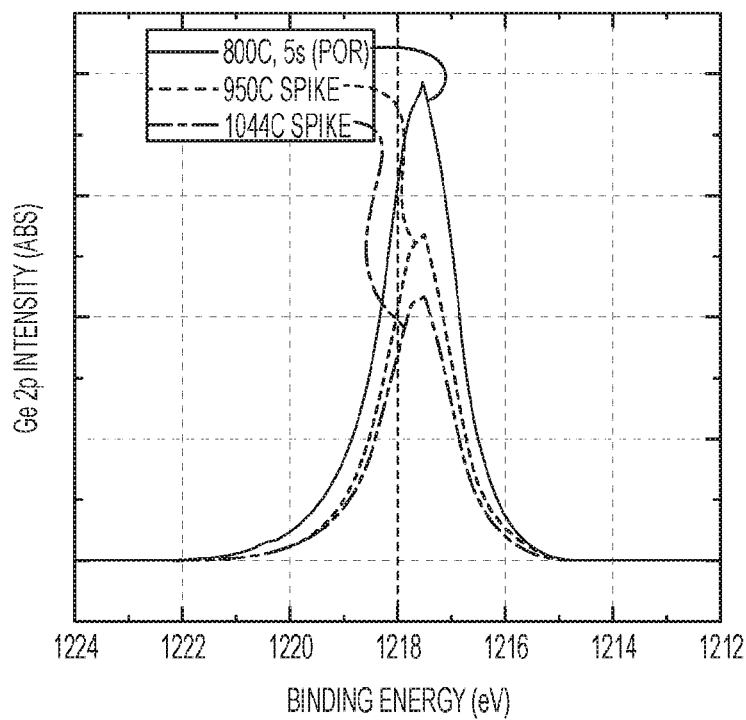
FIG. 16 is a graph of Ge 2p intensity versus binding energy for high temperature anneal at dummy gate on SiGe25% pFET.
Figure 17:
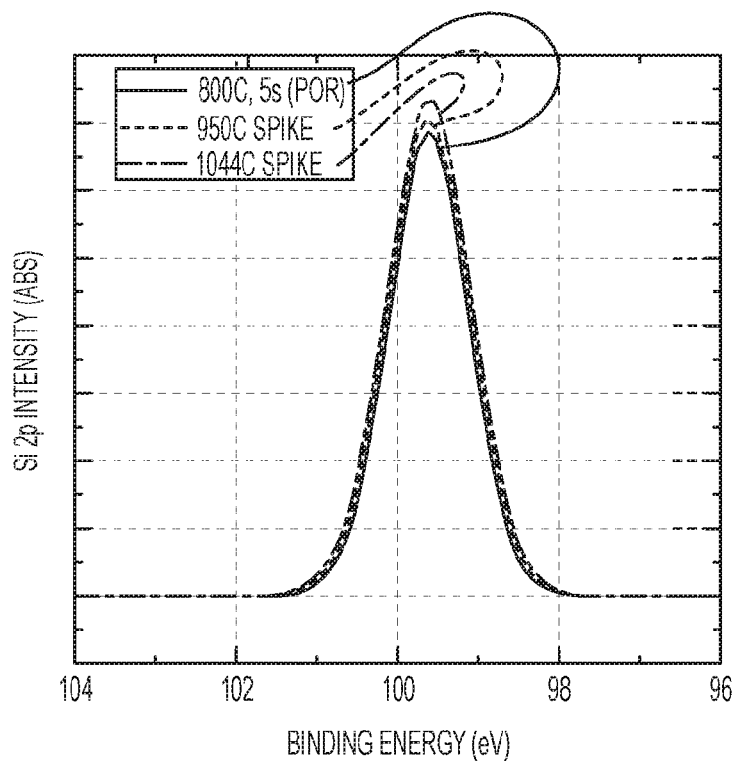
FIG. 17 is a graph of Si 2p intensity versus binding energy for high temperature anneal at dummy gate on SiGe25% pFET.

For the examples in FIGS. 16-17, a high temperature spike anneal was performed above 1000° C. A SiGeOx/SiGe layer/Si substrate is used for FIGS. 16-17, where the thickness of SiGeOx is in the range of 1 to 4 nm and the thickness of SiGe layer is 5 to 50 nm.

FIG. 16 is a graph of Ge 2p intensity versus binding energy for high temperature dummy gate anneal on SiGe25% pFET. FIG. 17 is a graph of Si 2p intensity versus binding energy for high temperature dummy gate anneal on SiGe25% pFET. As illustrated in FIGS. 16-17, high temperature dummy gate anneal provides a Si-rich top surface in SiGe channel due to the reaction of SiGeOx dummy oxide with the SiGe surface. The intensity of XPS is proportional to Si/Ge percentage in the SiGe layer. After high temperature dummy gate anneal at 1044° C., a dramatic reduction of intensity in the portion of the Ge 2p core-level spectra associated with Ge—Ge element is observed, while Si 2p core-level spectra shows the increase of Si—Si element intensity. FIGS. 16-17 indicate a Si-rich top surface in the SiGe channel is formed.

Figure 18:
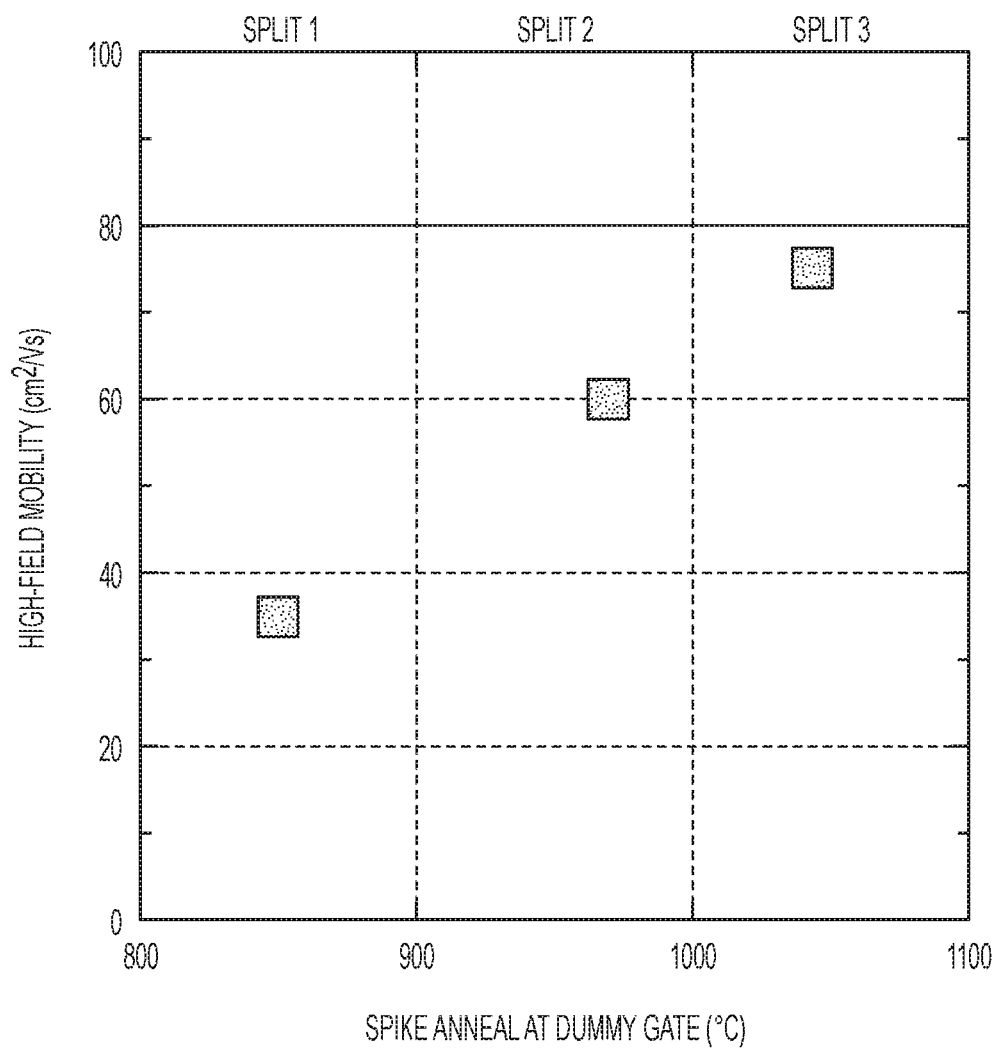
FIG. 18 is a graph illustrating high-field mobility versus spike anneal temperature at dummy gate.
Figure 19:
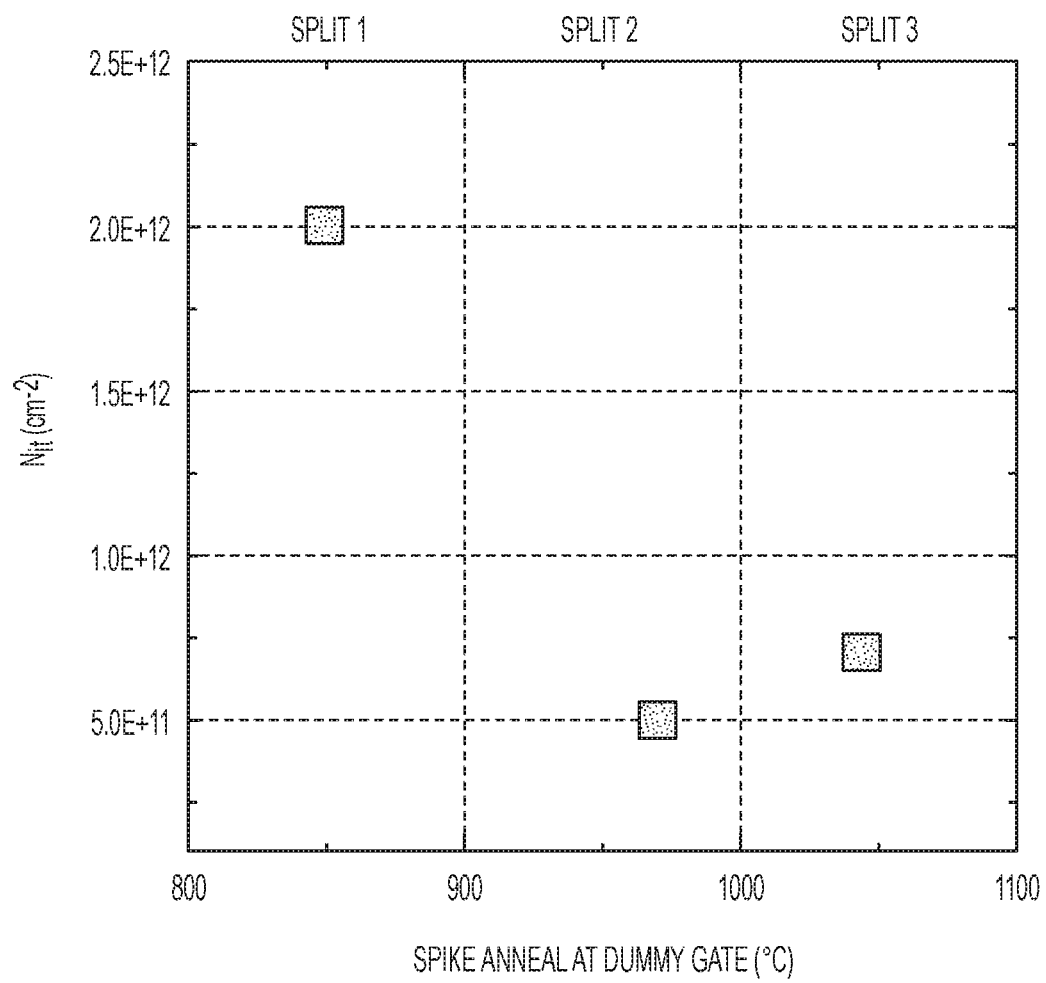
FIG. 19 is a graph illustrating Nit versus spike anneal temperature at dummy gate.

For FIGS. 18-19, the dielectric layer is HfO$_2$ and gate material is TiN/TiAlC/TiN clustered layer, and fill metal is tungsten. FIG. 18 illustrates high-field mobility versus dummy gate anneal temperature. FIG. 19 illustrates number of interface trap versus dummy gate anneal temperature.

FIGS. 18-19 relate to an example of a SiGe25% pFET manufactured according to three different methods. Split 1 refers to a pFET manufactured with a method that skips the spike anneal at RMG, Split 2 refers to a pFET manufactured using conventional methods. SiGeOx/SiGe layer/Si substrate is used for FIGS. 16-17, where the thickness of SiGeOx is in the range of 1 to 4 nm and the thickness of SiGe layer is 5 to 50 nm. Split 3 refers to the disclosed method including a high temperature dummy gate anneal including a 1044° C. anneal temperature spike.

The disclosed method significantly reduces the thermal budget of the downstream process, especially for RMG process, as compared to conventional processes.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

For the sake of brevity, conventional techniques related to semiconductor device and IC fabrication cannot be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps have only been mentioned briefly herein or have omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the disclosed combination of operations and/or resulting structures of the present invention are unique. Thus, the unique combination of the operations described in connection with the present embodiments of the invention utilize a variety of individually known physical and chemical processes performed on a semiconductor (e.g., silicon) substrate, some of which are described in the following immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a semiconductor device, the method comprising:
   forming a pFET region including:
      a SiGe channel;
      a first set of spacers extending from the top surface of the SiGe channel; and
      a first dummy oxide including SiGeOx, wherein the first dummy oxide layer is positioned between the first set of spacers;
   providing an nFET region including:
      a Si channel;
      a second set of spacers extending from the top surface of the Si channel; and
      a second dummy oxide layer including SiOx, wherein the second dummy oxide layer is positioned between the second set of spacers;
   annealing the pFET and the nFET region to yield a Si-rich layer on a top surface of the SiGe channel;
   removing the first dummy oxide layer and the second dummy oxide layer; and
   depositing a first gate material between the first set of spacers and a second gate material between the second set of spacers.

2. The method of claim 1, wherein the annealing includes subjecting the pFET region and nFET region to a temperature of 950 to 1077° C.

3. The method of claim 1 further comprising, before depositing the first gate material, depositing a first high-k dielectric layer in contact with the spacers.

4. The method of claim 1 further comprising, before depositing the second gate material, depositing a second high-k dielectric layer in contact with the second set of spacers.

5. The method of claim 3 further comprising, before depositing the first high-k dielectric layer, exposing the Si-rich layer to ozone to form an ozone layer.

6. The method of claim 4 further comprising, before depositing the second high-k dielectric layer, exposing the top portion of the Si channel located between the second set of spacers to ozone to form an ozone layer.

7. The method of claim 5, wherein the ozone layer is positioned between the Si-rich surface and the first high-k dielectric layer.

8. The method of claim 6, wherein the ozone layer is positioned between the portion of the top surface of the Si channel located between the second set of spacers surface and the second high-k dielectric layer.

9. The method of claim 1, further comprising forming source and drain regions within the nFET region and the pFET region.

10. The method of claim 1, wherein the first high-k dielectric layer and second high-k dielectric layer are independently selected from silicon nitride, aluminum oxide, zirconium oxide, titanium oxide, tantalum pentoxide, barium-strontium-titanate, strontium-titanate-oxide, lead-zirconium-titanate, and combinations thereof.

11. The method of claim 1, wherein the first gate material and second gate material are independently selected from TiN, TiAl, TaN, and combinations thereof.

12. The method of claim 1, wherein the Si-rich surface has a concentration of Ge is at least 10% lower than the concentration of Ge in the SiGe channel.

13. The method of claim 1, wherein the Si-rich surface has a concentration of Ge is at least 5% lower than the concentration of Ge in the SiGe channel.

* * * * *